US012689010B2

(12) United States Patent
L'Heureux et al.

(10) Patent No.: US 12,689,010 B2
(45) Date of Patent: Jul. 21, 2026

(54) HIGH EFFICIENCY TRAP FOR PARTICLE COLLECTION IN A VACUUM FORELINE

(71) Applicant: Applied Materials, Inc., Santa Clara, CA (US)

(72) Inventors: James L'Heureux, Santa Clara, CA (US); Ryan Thomas Downey, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 243 days.

(21) Appl. No.: 17/610,675

(22) PCT Filed: Jun. 2, 2020

(86) PCT No.: PCT/US2020/035785
§ 371 (c)(1),
(2) Date: Nov. 11, 2021

(87) PCT Pub. No.: WO2020/263513
PCT Pub. Date: Dec. 30, 2020

(65) Prior Publication Data
US 2022/0199380 A1     Jun. 23, 2022

Related U.S. Application Data

(60) Provisional application No. 62/866,472, filed on Jun. 25, 2019.

(51) Int. Cl.
*B01D 45/16* (2006.01)
*B01D 51/06* (2006.01)
*H01J 37/32* (2006.01)

(52) U.S. Cl.
CPC ........ *H01J 37/32844* (2013.01); *B01D 45/16* (2013.01); *B01D 51/06* (2013.01);
(Continued)

(58) Field of Classification Search
CPC .......... H01J 37/32844; H01J 37/32834; B01D 45/16; B01D 51/06; B01D 2257/2066;
(Continued)

(56) References Cited

U.S. PATENT DOCUMENTS 1,836,758 A * 12/1931 Knapp ...................... B04C 1/00
55/423
2,229,860 A * 1/1941 Mccurdy ............ B01D 21/0012
55/395
(Continued)

FOREIGN PATENT DOCUMENTS

CN         101316794 A     12/2008
CN         103380337 A     10/2013
(Continued)

OTHER PUBLICATIONS

Taiwan Office Action for Application No. 109120572 dated Jun. 13, 2023.
(Continued)

*Primary Examiner* — Dung H Bui
(74) *Attorney, Agent, or Firm* — Patterson + Sheridan, LLP

(57) ABSTRACT

Embodiments disclosed herein include a particle collection trap for an abatement system for abating compounds produced in semiconductor processes. The particle collection trap includes a device for producing spiral gas flow in the particle collection trap. The spiral gas flow causes particles, which are heavier than the gas, to travel to the outside diameter of the flow path where the gas velocity is slower and to drop out of the gas stream. The device may be a spiral member coupled to a hollow tube or a rolled member having an inner portion coupled to a hollow tube. The particle collection trap increases the accumulation rate of particles in the gas stream without reducing the velocity of the gas flow.

18 Claims, 5 Drawing Sheets

(52) U.S. Cl.
CPC ................ *B01D 2257/2066* (2013.01); *B01D 2258/0216* (2013.01); *B01D 2259/818* (2013.01)

(58) Field of Classification Search
CPC ...... B01D 2258/0216; B01D 2259/818; B01D 2257/206; B01D 53/32; C23C 16/4412; Y02C 20/30
See application file for complete search history.

(56) References Cited

U.S. PATENT DOCUMENTS

| | | | | |
|---|---|---|---|---|
| 2,316,729 | A * | 4/1943 | Tryon | F16N 19/00 251/126 |
| 2,705,053 | A * | 3/1955 | Morris | F16N 39/002 210/512.1 |
| 2,970,669 | A * | 2/1961 | Bergson | B01D 5/0072 165/133 |
| 3,352,090 | A * | 11/1967 | Stillebroer | E21B 43/38 96/208 |
| 3,800,513 | A * | 4/1974 | Lappin | B01D 47/06 96/361 |
| 4,559,068 | A | 12/1985 | Lagerstedt et al. | |
| 4,678,588 | A * | 7/1987 | Shortt | B01D 45/16 210/512.1 |
| 5,113,671 | A * | 5/1992 | Westermeyer | F25B 43/02 62/84 |
| 5,403,473 | A * | 4/1995 | Moorehead | B01D 21/267 210/232 |
| 5,698,014 | A * | 12/1997 | Cadle | B01D 19/0063 96/216 |
| 5,840,198 | A * | 11/1998 | Clarke | B01D 21/2422 210/522 |
| 6,019,825 | A * | 2/2000 | Greene | B04C 5/103 96/216 |
| 6,131,405 | A * | 10/2000 | Griffin | F25B 43/02 62/84 |
| 6,287,463 | B1 | 9/2001 | Ohkawa | |
| 6,298,687 | B1 * | 10/2001 | Dienhart | F28D 7/024 62/513 |
| 6,463,757 | B1 * | 10/2002 | Dickson | F25B 43/006 62/509 |
| 6,752,856 | B1 * | 6/2004 | Graze, Jr. | B01D 50/20 55/DIG. 19 |
| 6,752,861 | B2 * | 6/2004 | Spinelli | B01D 45/16 55/459.3 |
| 6,821,322 | B2 | 11/2004 | Milia | |
| 7,780,766 | B2 * | 8/2010 | Thompson | B01D 53/002 95/254 |
| 10,029,064 | B2 * | 7/2018 | Ota | A61M 16/208 |
| 10,933,351 | B2 * | 3/2021 | Hoffman | B01D 45/12 |
| 11,209,017 | B2 * | 12/2021 | Eskandar | F02C 9/16 |
| 2001/0003892 | A1 * | 6/2001 | Rikyuu | C23C 16/4412 55/444 |
| 2003/0037460 | A1 * | 2/2003 | Song | D06F 58/04 34/595 |
| 2003/0154860 | A1 | 8/2003 | Milia | |
| 2009/0114601 | A1 * | 5/2009 | Lean | B01D 21/265 210/205 |
| 2015/0252473 | A1 | 9/2015 | Dickinson | |
| 2016/0271542 | A1 | 9/2016 | Huff et al. | |
| 2019/0086075 | A1 * | 3/2019 | Albert | F22B 21/00 |
| 2019/0134648 | A1 * | 5/2019 | Hu | B04C 3/06 |

FOREIGN PATENT DOCUMENTS

| | | |
|---|---|---|
| CN | 106029217 A | 10/2016 |
| CN | 108031204 A | 5/2018 |
| CN | 108953986 A | 12/2018 |
| EP | 0140402 A2 | 5/1985 |
| JP | H11028302 A | 2/1999 |
| JP | 2002013845 A | 1/2002 |
| TW | 201630650 A | 9/2016 |

OTHER PUBLICATIONS

International Search Report and Written Opinion dated Sep. 1, 2020, regarding PCT/US2020/035785.
Taiwan Office Action for Application No. 109120572 dated Sep. 27, 2022.
Taiwan Office Action for Application No. 109120572 dated Mar. 22, 2022.
Chinese Office Action for Application No. 202080041986.0 dated Sep. 9, 2022.
Korean Office Action for Application No. 10-2022-7002174 dated Jul. 17, 2024.
Chinese Office Action for Application No. 202080041986.0 dated Sep. 18, 2024.
Chinese Office Action for Application No. 202080041986.0 dated Oct. 18, 2023.
Korean Office Action for Application No. 10-2022-7002174 dated Mar. 31, 2025.
Chinese Office Action for Application No. 202080041986.0 dated Jan. 26, 2025.
Korean Office Action for Application No. 10-2022-7002174 dated Dec. 30, 2025.

* cited by examiner

HIGH EFFICIENCY TRAP FOR PARTICLE COLLECTION IN A VACUUM FORELINE

BACKGROUND

Field

Embodiments of the present disclosure generally relate to semiconductor processing equipment. More particularly, embodiments of the present disclosure relate to a particle collection trap for an abatement system.

Description of the Related Art

The process gases used by semiconductor processing facilities include many compounds, such as perfluorocarbons (PFCs), which must be abated or treated before disposal, due to regulatory requirements and environmental and safety concerns. Typically, a remote plasma source may be coupled to a processing chamber to abate the compounds exiting the processing chamber. A reagent may be injected into the plasma source to assist the abatement of the compounds.

Conventional abatement technology for abating PFCs utilizes water vapor as a reagent, which provides good destruction removal efficiency (DRE). However, abatement of certain compounds using water vapor in the remote plasma source can result in the formation of solid particles in the remote plasma source and equipment downstream of the remote plasma source, such as exhaust line and pumps. In addition, the exhaust exiting the remote plasma source may be at an elevated temperature, which can cause issues at the pump downstream of the remote plasma source.

Accordingly, what is needed in the art is an improved particle collection trap for an abatement system for abating compounds produced in semiconductor processes.

SUMMARY

Embodiments of the present disclosure generally relate to semiconductor processing equipment. More particularly, embodiments of the present disclosure relate to a particle collection trap for an abatement system. In one embodiment, a particle collection trap includes a body having a side wall, a first end, and a second end opposite the first end. The particle collection trap further includes a hollow tube extending from the first end to the second end, and an opening is formed in the hollow tube at the second end. The particle collection trap further includes a spiral member coupled to the hollow tube and the side wall extending from the first end to the second end.

In another embodiment, a particle collection trap includes a body having a side wall, a first end, and a second end opposite the first end. The particle collection trap further includes a hollow tube extending from the first end to the second end, and one or more openings are formed in the hollow tube at the second end. The particle collection trap further includes a rolled member extending from the first end to the second end and from the hollow tube to the side wall in a spiral pattern.

In another embodiment, an abatement system includes a plasma source and a particle collection trap disposed downstream of the plasma source. The particle collection trap is configured to provide a spiral path for a gas stream exiting the plasma source.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments disclosed herein include a particle collection trap for an abatement system for abating compounds produced in semiconductor processes. The particle collection trap includes a device for producing spiral gas flow in the particle collection trap. The spiral gas flow causes particles, which are heavier than the gas, to travel to the outside diameter of the flow path where the gas velocity is slower and to drop out of the gas stream. The device may be a spiral member coupled to a hollow tube or a rolled member having an inner portion coupled to a hollow tube. The particle collection trap increases the accumulation rate of particles in the gas stream without reducing the speed of the gas flow.

Figure 1:
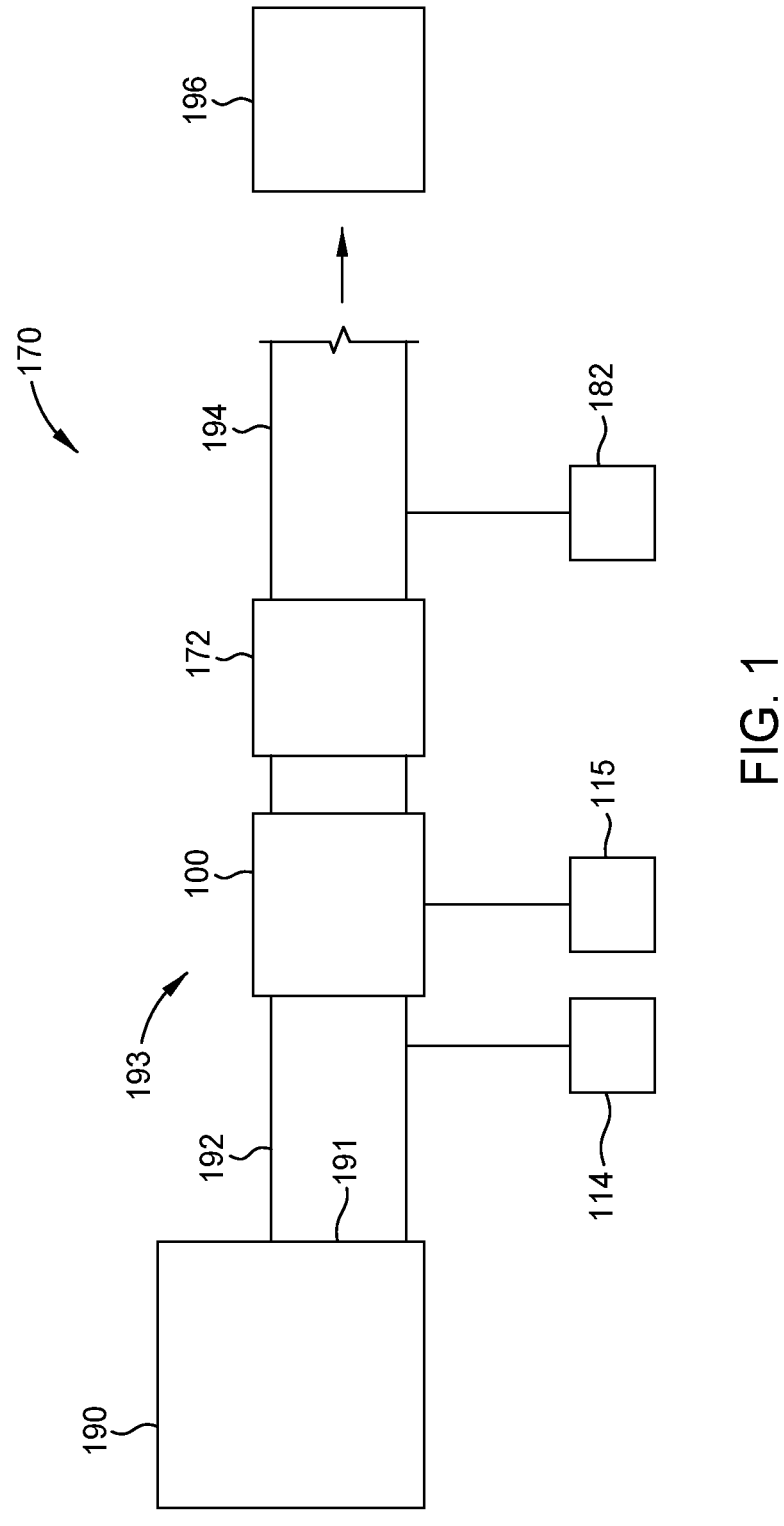
FIG. 1 is a schematic side view of a vacuum processing system including a particle collection trap according to one embodiment described herein.

FIG. 1 is a schematic side view of a vacuum processing system 170 having a particle collection trap 172 utilized in an abatement system 193. The vacuum processing system 170 includes at least a vacuum processing chamber 190, a plasma source 100, and the particle collection trap 172. The abatement system 193 includes at least the plasma source 100 and the particle collection trap 172. The vacuum processing chamber 190 is generally configured to perform at least one integrated circuit manufacturing process, such as a deposition process, an etch process, a plasma treatment process, a preclean process, an ion implant process, or other integrated circuit manufacturing process. The process performed in the vacuum processing chamber 190 may be plasma assisted. For example, the process performed in the vacuum processing chamber 190 may be a plasma deposition process for depositing a material on a substrate or a plasma etch process for removing a material from a substrate.

The vacuum processing chamber 190 has a chamber exhaust port 191 coupled to the plasma source 100 of the abatement system 193 via a foreline 192. The particle collection trap 172 is located downstream of the plasma source 100 in order to collect particles formed in the plasma source and to cool the exhaust exiting the plasma source. The particle collection trap 172 is coupled to an exhaust conduit 194 to pumps and facility exhaust, schematically indicated by a single reference numeral 196 in FIG. 1. The pumps are generally utilized to evacuate the vacuum processing chamber 190, while the facility exhaust generally includes scrubbers or other exhaust cleaning apparatus for preparing the effluent of the vacuum processing chamber 190 to enter the atmosphere.

The plasma source 100 is utilized to perform an abatement process on gases and/or other materials exiting the vacuum processing chamber 190 so that such gases and/or other materials may be converted into a more environmentally and/or process equipment friendly composition. In some embodiments, an abatement reagent source 114 is couple to the foreline 192 and/or the plasma source 100. The abatement reagent source 114 provides an abatement reagent into the plasma source 100 which may be energized to react with or otherwise assist converting the materials to be exiting the vacuum processing chamber 190 into a more environmentally and/or process equipment friendly composition. Optionally, a purge gas source 115 may be coupled to the plasma source 100 for reducing deposition on components inside the plasma source 100.

The particle collection trap 172 is coupled between the plasma source 100 and the pumps and facility exhaust 196. In one example, the particle collection trap 172 is a part of the abatement system 193.

Optionally, a pressure regulating module 182 may be coupled to at least one of the plasma source 100 or the exhaust conduit 194. The pressure regulating module 182 injects a pressure regulating gas, such as Ar, N, or other suitable gas which allows the pressure within the plasma source 100 to be better controlled, and thereby provide more efficient abatement performance. In one example, the pressure regulating module 182 is a part of the abatement system 193.

Figure 2A:
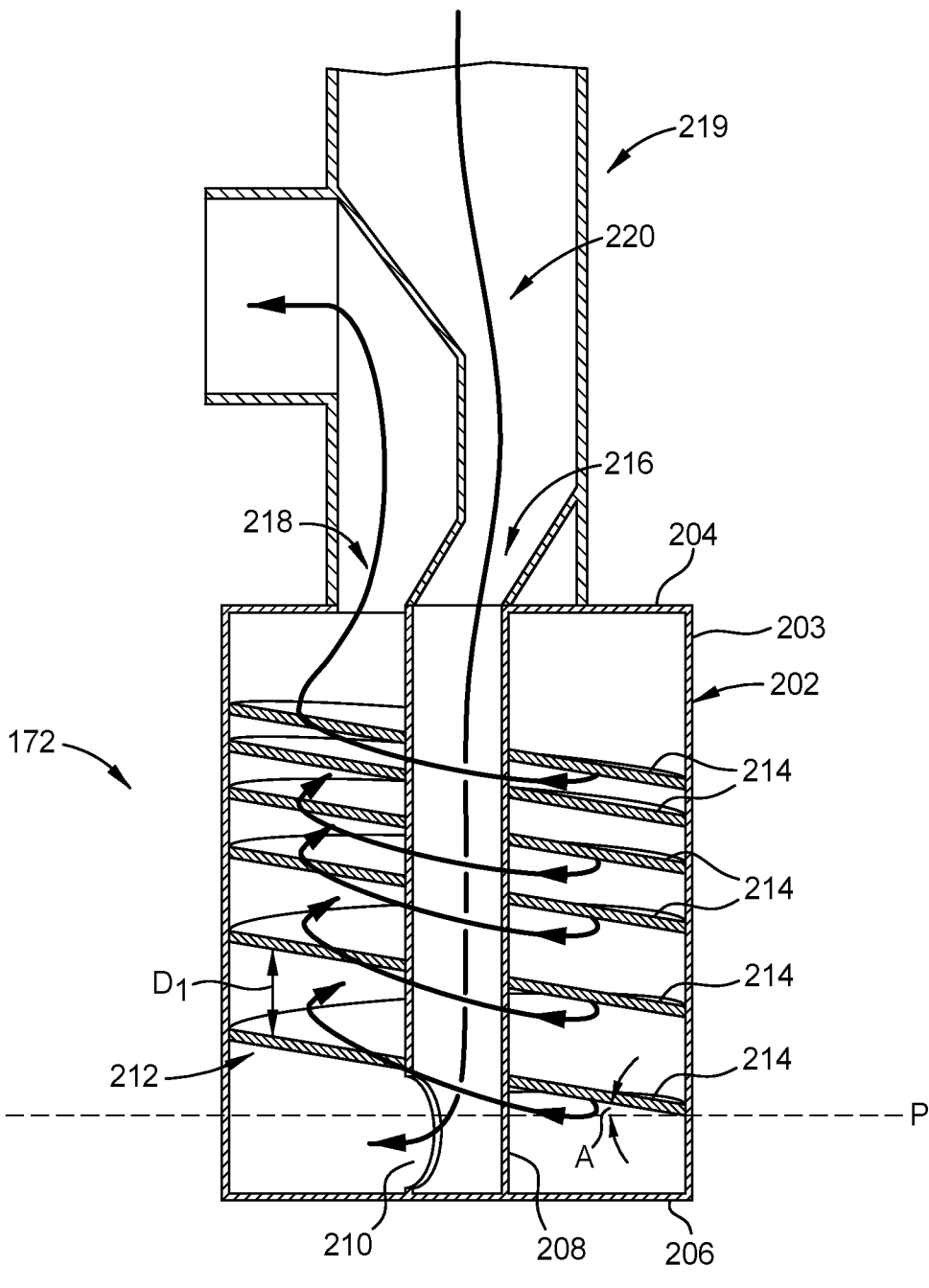
FIG. 2A is a schematic cross-sectional view of the particle collection trap according to one embodiment described herein.

FIG. 2A is a schematic cross-sectional view of the particle collection trap 172 according to one embodiment described herein. As shown in FIG. 2A, the particle collection trap 172 includes a body 202 having a side wall 203, a first end 204 and a second end 206 opposite the first end 204. The body 202 may have any suitable shape. In one embodiment, the body 202 is cylindrical. The particle collection trap 172 further includes a hollow tube 208 extending from the first end 204 to the second end 206. The hollow tube 208 includes an opening 210 adjacent the second end 206. A spiral member 212 is coupled to the hollow tube 208 and the side wall 203 extending from the first end 204 to a location above the opening 210 adjacent the second end 206. The spiral member 212 may be a single piece of material. The spiral member 212 includes a plurality of levels 214 and a distance $D_1$ between adjacent levels 214. In one embodiment, the spiral member 212 has a helical spiral shape having the plurality of levels 214. For example, the spiral member 212 may be a continuous helical spiral structure wrapping around the hollow tube 208 extending from the first end 204 to the location above the opening 210 adjacent the second end 206, and each level 214 of the spiral member 212 is coupled to the hollow tube 208 and the side wall 203, as shown in FIG. 2A. The distance $D_1$ between adjacent levels 214 may be the same or different for the plurality of levels 214. In one embodiment, the distance $D_1$ is the greatest near the second end 206 and is the smallest near the first end 204, as shown in FIG. 2A. The distances between levels 214 in between the greatest distance $D_1$ near the second end 206 and the smallest distance $D_1$ near the first end 204 gradually decreases from the greatest distance $D_1$ near the second end 206 to the smallest distance $D_1$ near the first end 204. In another embodiment, the same distance $D_1$ is between every adjacent levels 214. The body 202 further includes an inlet port 216 disposed at the first end 204 and an outlet port 218 disposed at the first end 204. The body 202, the hollow tube 208, and the spiral member 212 may be fabricated from stainless steel, aluminum, nickel coated aluminum, or any suitable material.

The particle collection trap 172 may be coupled to a connecting device 219 for connecting to the plasma source 100 and the exhaust conduit 194. The connecting device 219 may be a pipe tee, as shown in FIG. 2A. During operation, a gas stream 220 exiting the plasma source 100 and enters the particle collection trap 172 via the connecting device 219 and the inlet port 216. The gas stream 220 flows down the hollow tube 208 and exits the hollow tube 208 through the opening 210. Each level 214 of the spiral member 212 may form an acute angle A with respect to a plane P substantially perpendicular to the direction of the gas stream 220 flowing in the hollow tube 208. The gas stream 220 flows upward in a spiral pattern by the spiral member 212 and exits the particle collection trap 172 through the outlet port 218. As the gas stream 220 flows upward in the spiral pattern, the centrifugal force causes solid particles in the gas stream 220 to travel to the outside diameter of the flow path where the velocity of the gas stream 220 is the slowest. The solid particles drop out of the gas stream 220 at the outside diameter of the flow path due to the slow velocity. In addition, the solid particles collide with the side wall 203 of the body 202, which also causes a velocity change and propensity to drop out of the gas stream 220. Furthermore, in the configuration where the distance $D_1$ between adjacent levels 214 of the spiral member 212 decreases from the second end 206 to the first end 204, the velocity of the gas stream 220 increases as the distance $D_1$ decreases. Thus, larger particles in the gas stream 220 drops out near the second end 206 while smaller particles in the gas stream 220 drops out near the first end 204 due to increased velocity of the gas stream 220 near the first end 204. The gas stream 220 flows to the pumps and facility exhaust 196 via the connecting device 219.

Unlike using a filter to trap solid particles in a gas stream, which reduces the velocity of the gas stream, the particle collection trap 172 is configured to provide a spiral path for the gas stream 220 to flow therethrough. The spiral path causes the solid particles to drop out of the gas stream 220 in the particle collection trap 172 without reducing the velocity of the gas stream 220. Furthermore, by varying the distance $D_1$ between adjacent levels 214 of the spiral member 212 of the particle collection trap 172, solid particles having various sizes drop out of the gas stream 220 at different levels 214. In some embodiments, the gas stream 220 is at an elevated temperature, which can cause issues at the pumps and facility exhaust 196. The particle collection trap 172 provides cooling of the gas stream 220.

Figure 2B:
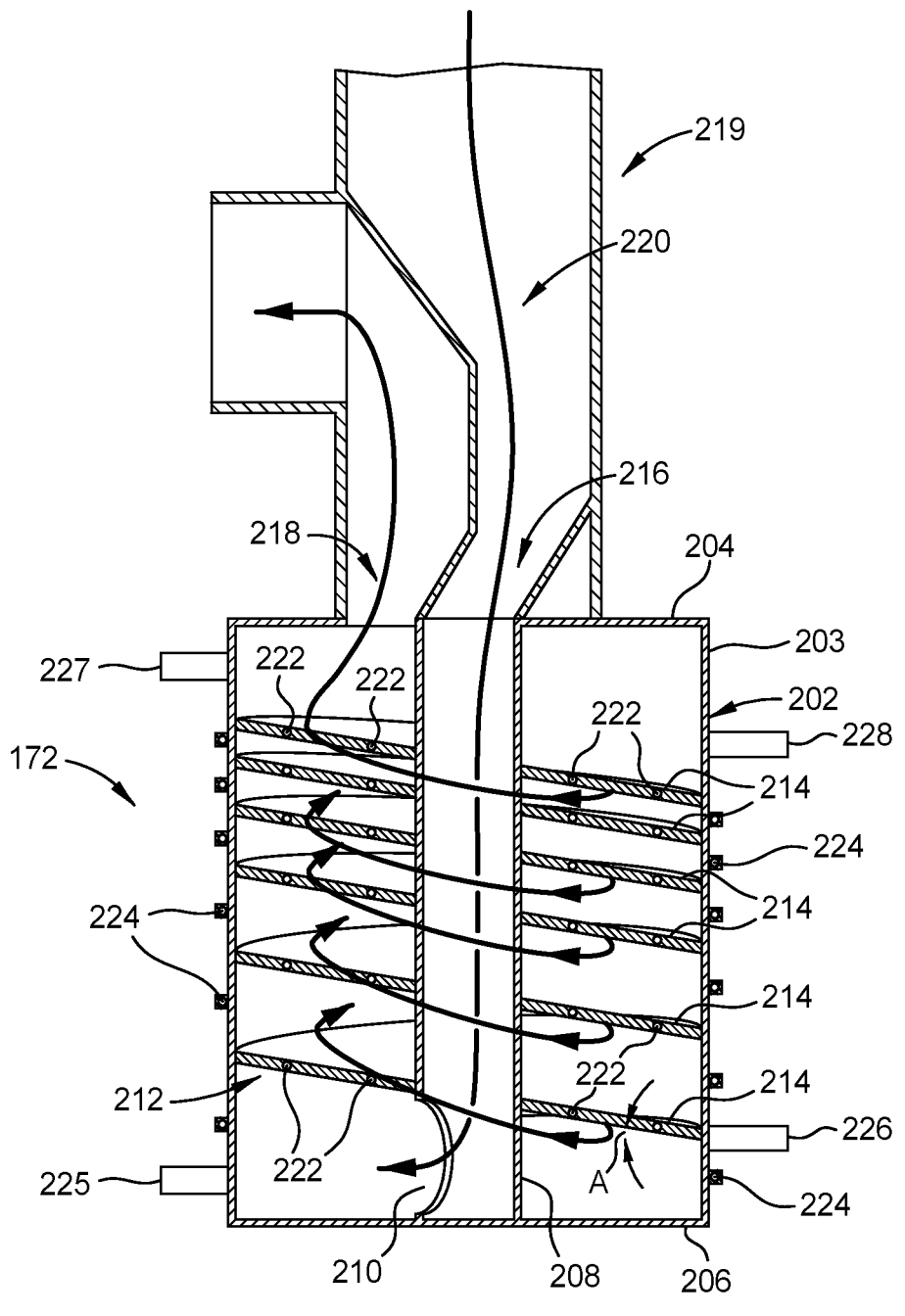
FIG. 2B is a schematic cross-sectional view of the particle collection trap of FIG. 2A according to another embodiment described herein.

FIG. 2B is a schematic cross-sectional view of the particle collection trap 172 of FIG. 2A according to another embodiment described herein. The particle collection trap 172 includes the body 202 having the side wall 203, the first end 204, and the second end 206. The spiral member 212 includes the plurality of levels 214. The spiral member 212 includes a cooling channel 222 formed therein for a coolant to flow therethrough. The body 202 includes an inlet port 226 and an outlet port 228 configured to allow a coolant to enter and exit the cooling channel 222. The coolant flows through the cooling channel 222 to cool the gas stream 220.

The coolant may be any suitable coolant, such as deionized water. A conduit 224 may be surrounding the body 202 and the conduit 224 is connected to an inlet port 225 and an outlet port 227. The inlet port 225 and the outlet port 227 are configured to allow a coolant to enter and exit the conduit 224. The coolant flows through the conduit 224 to provide further cooling of the gas stream 220. In some embodiments, instead of the conduit 224, a cooling channel is formed in the side wall 203. In one embodiment, the cooling channel 222 is in fluid communication with the conduit 224, and the inlet port 225 and the outlet port 227 are not utilized. The coolant flows through the inlet port 226, the cooling channel 222, the conduit 224, and the outlet port 228. In another embodiment, the cooling channel 222 is not in fluid communication with the conduit 224.

Figure 3A:
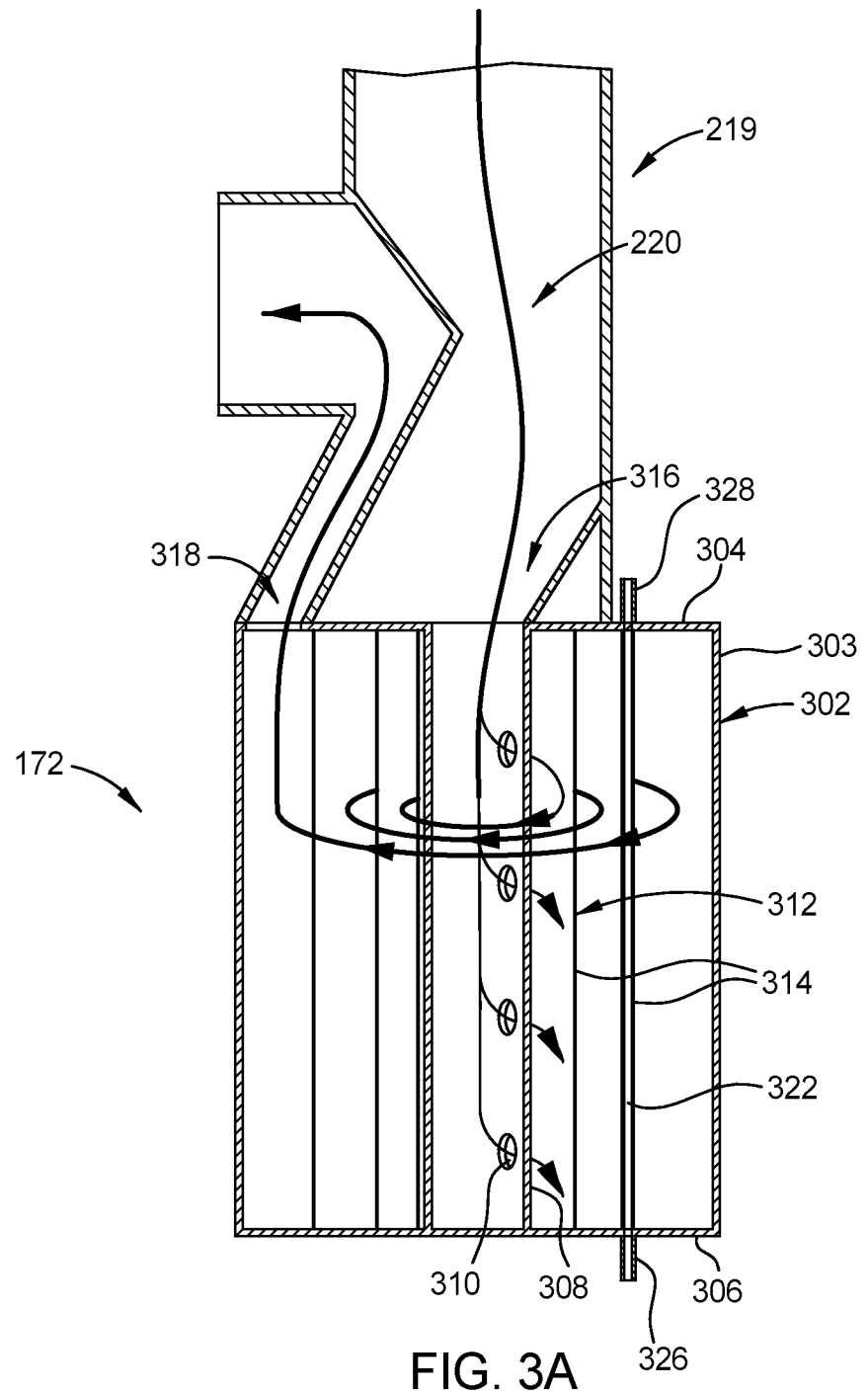
FIG. 3A is a schematic cross-sectional view of the particle collection trap according to one embodiment described herein.

FIG. 3A is a schematic cross-sectional view of the particle collection trap 172 according to one embodiment described herein. As shown in FIG. 3A, the particle collection trap 172 includes a body 302 having a side wall 303, a first end 304 and a second end 306 opposite the first end 304. The body 302 may have any suitable shape. In one embodiment, the body 302 is cylindrical. The particle collection trap 172 further includes a hollow tube 308 extending from the first end 304 to the second end 306. The hollow tube 308 includes one or more openings 310 formed along the hollow tube 308 in the direction the gas stream 220 is flowing. The one or more openings 310 may have any suitable shape. In one embodiment, the one or more openings 310 are vertical slits disposed along the hollow tube 308. The one or more openings 310 may have the same size or different in size. In one embodiment, the openings 310 located near the second end 306 are larger than the openings 310 located near the first end 304. In one embodiment, the openings 310 are formed from the second end 306 to a location that is about 75 percent of the length of the hollow tube 308, such as about 50 percent of the length of the hollow tube 308. The spacing between adjacent openings 310 may be the same or may be different. In one embodiment, the distance between adjacent openings 310 at the second end 306 is larger than the distance between adjacent openings 310 near the first end 304, and the distance between adjacent openings 310 gradually decreases from the second end 306 to the first end 304.

A rolled member 312 extends from the first end 304 to the second end 306. The rolled member 312 also extends from the hollow tube 308 to the side wall 303 in a non-helical spiral pattern. For example, the rolled member 312 has an inner portion 313 (shown in FIG. 3B) coupled to or adjacent to the hollow tube 308 and an outer portion 315 (shown in FIG. 3B) coupled to or adjacent to the side wall 303. The rolled member 312 winds around the hollow tube 308 with continuously increasing distance from the hollow tube. The rolled member 312 includes a plurality of layers 314 and a distance $D_2$ between adjacent layers 314. The rolled member 312 may be a single piece of material. The distance $D_2$ between adjacent layers 314 may be the same or different for the plurality of layers 314. In one embodiment, the distance $D_2$ is the greatest near the hollow tube 308 and is the smallest near the side wall 303. The distances between layers 314 in between the greatest distance $D_2$ near the hollow tube 308 and the smallest distance $D_2$ near the side wall 303 gradually decreases from the greatest distance $D_2$ near hollow tube 308 to the smallest distance $D_2$ near the side wall 303. In another embodiment, the same distance $D_2$ is between every adjacent layers 314, as shown in FIG. 3A. The body 302 further includes an inlet port 316 disposed at the first end 304 and an outlet port 318 disposed at the first end 304. The body 302, the hollow tube 308, and the rolled member 312 may be fabricated from stainless steel, aluminum, nickel coated aluminum, or any suitable material.

Figure 3B:
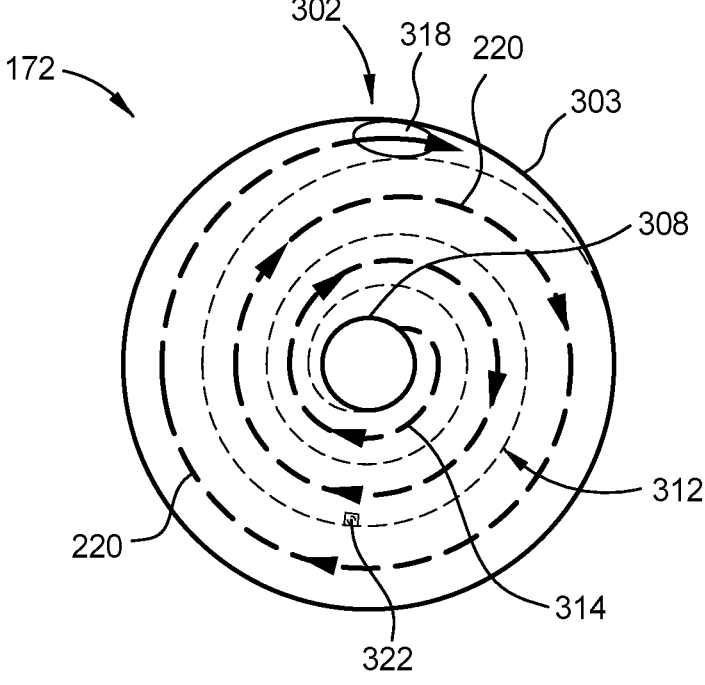
FIG. 3B is a schematic top view of the particle collection trap of FIG. 3A according to one embodiment described herein.

The particle collection trap 172 may be coupled to the connecting device 219 for connecting to the plasma source 100 and the exhaust conduit 194. During operation, the gas stream 220 exiting the plasma source 100 and enters the particle collection trap 172 via the connecting device 219 and the inlet port 316. The gas stream 220 flows down the hollow tube 308 and exits the hollow tube 308 through the openings 310. FIG. 3B is a schematic top view of the particle collection trap 172 of FIG. 3A according to one embodiment described herein. As shown in FIG. 3B, the gas stream 220 flows a spiral pattern by the rolled member 312 and exits the particle collection trap 172 through the outlet port 318. As the gas stream 220 flows in the spiral pattern, centrifugal force causes solid particles in the gas stream 220 to travel to the outside diameter of the flow path where the velocity of the gas stream 220 is the slowest. The solid particles drop out of the gas stream 220 at the outside diameter of the flow path due to the slow velocity. In addition, the solid particles collide with the layers 314 of the body rolled member 312, which also causes a velocity change and propensity to drop out of the gas stream 220. Furthermore, in the configuration where the distance $D_2$ between adjacent layers 314 of the rolled member 312 decreases from the hollow tube 308 to the side wall 303, the velocity of the gas stream 220 increases as the distance $D_2$ decreases. Thus, larger particles in the gas stream 220 drops out near the hollow tube 308 while smaller particles in the gas stream 220 drops out near the side wall 303 due to increased velocity of the gas stream 220 near the side wall 303. The gas stream 220 flows to the pumps and facility exhaust 196 via the connecting device 219.

Referring to FIGS. 3A and 3B, the rolled member 312 includes the plurality of layers 314. One or more layers 314 may include a cooling channel 322 formed therein for a coolant to flow therethrough. The cooling channel 322 may be in fluid communication with an inlet port 326 and an outlet port 328 configured to allow a coolant to enter and exit the cooling channel 322. The coolant flows through the cooling channel 322 to cool the gas stream 220. The coolant may be any suitable coolant, such as deionized water.

The particle collection trap 172 may be fabricated by any suitable method. In one embodiment, one or more components of the particle collection trap 172 are fabricated by 3D printing. For example, the spiral member 212 including the cooling channel 222 (shown in FIG. 2B) and the rolled member including the cooling channel 322 (shown in FIGS. 3A and 3B) are fabricated by 3D printing.

While the foregoing is directed to embodiments of the present disclosure, other and further embodiments of the disclosure may be devised without departing from the basic scope thereof, and the scope thereof is determined by the claims that follow.

What is claimed is:

1. A particle collection trap, comprising:
   a body comprising a side wall, a first end, and a second end opposite the first end;
   a hollow tube disposed in the body, the hollow tube extending from an opening to an interior of the body through the first end of the body and terminating in direct contact with the second end of the body, the hollow tube having one or more openings being formed in the hollow tube at the second end;
   an inlet port at the first end open to an interior of the hollow tube;

a rolled member disposed in the body around the hollow tube, the rolled member having a top, a bottom, a first edge and a second edge, the rolled member extending along the top in contact with the first end to the bottom in contact with the second end, the rolled member and extending in a non-helical spiral coil pattern from the first edge at the hollow tube to a second edge at the side wall; and an outlet port open to the interior of the body, an entirety of the outlet port disposed through the first end and adjacent the side wall.

2. The particle collection trap of claim 1, wherein the body, the hollow tube, and the rolled member each comprises stainless steel, aluminum, or nickel coated aluminum.

3. The particle collection trap of claim 1, wherein the rolled member comprises an inner portion at the hollow tube and an outer portion at the side wall, wherein the rolled member winds around the hollow tube with continuously increasing distance from the hollow tube.

4. The particle collection trap of claim 3, wherein the rolled member is fabricated from a single piece of material.

5. The particle collection trap of claim 1, wherein the one or more openings comprises one or more vertical slits.

6. The particle collection trap of claim 1, wherein the one or more openings have the same size.

7. The particle collection trap of claim 1, wherein the one or more openings have different sizes.

8. A abatement system, comprising:

a plasma source; and a particle collection trap disposed downstream of the plasma source, the particle collection trap of claim 1 being configured to provide a spiral path for a gas stream exiting the plasma source.

9. The abatement system of claim 8, wherein the particle collection trap comprises a rolled member.

10. The abatement system of claim 8 wherein the plasma source is configured to be fluidly coupled to an exhaust port of a vacuum processing system via a foreline.

11. The abatement system of claim 8 further comprising:

a vacuum pump coupled to the outlet of the particle collection trap, wherein the vacuum pump is configured to pump fluid from the vacuum processing system through the abatement system.

12. The abatement system of claim 8, wherein a fluid pathway through the particle collection trap is open from the first end to the second end while extending around the rolled member to the second edge at the side wall.

13. The abatement system of claim 8, wherein the body is configured to direct a fluid entering the inlet port about the rolled member and out the outlet port.

14. The particle collection trap of claim 1, wherein a fluid pathway through the particle collection trap is open from the first end to the second end while extending around the rolled member to the second edge at the side wall.

15. The particle collection trap of claim 1, wherein the body is configured to direct a fluid entering the inlet port about the rolled member and out the outlet port.

16. The particle collection trap of claim 1, wherein the body further comprises a fluid passageway fluidly coupling the inlet port to the outlet port, wherein all fluid entering the inlet port is directed by the fluid passageway to leave the body of the particle collection trap at the outlet port.

17. The particle collection trap of claim 1, wherein rolled member winds around the hollow tube with continuously increasing distance from the hollow tube.

18. The particle collection trap of claim 1, wherein the rolled member comprises:

a plurality of layers formed from each successive roll of the rolled member about the hollow tube, wherein distances between each layer of the rolled member is greatest near the hollow tube and the smallest near the side wall.

\* \* \* \* \*